(12) United States Patent
Yoon et al.

(10) Patent No.: US 8,344,969 B2
(45) Date of Patent: Jan. 1, 2013

(54) DISPLAY DEVICE

(75) Inventors: Ji-Hwan Yoon, Kyunggi-do (KR); Kwan-Hee Lee, Kyunggi-do (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1324 days.

(21) Appl. No.: 12/076,401

(22) Filed: Mar. 18, 2008

(65) Prior Publication Data

US 2009/0033596 A1 Feb. 5, 2009

(30) Foreign Application Priority Data

Aug. 2, 2007 (KR) .................. 10-2007-0077727

(51) Int. Cl.
*G09G 3/30* (2006.01)

(52) U.S. Cl. ........... 345/76; 345/77; 345/82; 345/87; 345/103

(58) Field of Classification Search .................. None
See application file for complete search history.

(56) References Cited

U.S. PATENT DOCUMENTS

| | | | |
|---|---|---|---|
| 7,400,367 B2 | 7/2008 | Matsushima | |
| 7,732,809 B2 | 6/2010 | Adachi et al. | |
| 2003/0052869 A1* | 3/2003 | Fujii et al. | 345/204 |
| 2003/0112397 A1* | 6/2003 | Lee | 349/129 |
| 2003/0201960 A1 | 10/2003 | Fujieda | |
| 2005/0035353 A1 | 2/2005 | Adachi et al. | |
| 2005/0048224 A1* | 3/2005 | Araya et al. | 428/1.3 |
| 2005/0140278 A1 | 6/2005 | Kato | |
| 2005/0141242 A1 | 6/2005 | Takeuchi | |
| 2007/0080912 A1* | 4/2007 | Asao | 345/87 |

FOREIGN PATENT DOCUMENTS

| | | |
|---|---|---|
| CN | 1 550 840 A | 12/2004 |
| CN | 1 591 101 A | 3/2005 |
| CN | 1 621 928 A | 6/2005 |
| EP | 1 475 655 A1 | 11/2004 |
| JP | 09-073070 A | 3/1997 |
| JP | 2000-075287 A | 3/2000 |
| JP | 2002-140022 A | 5/2002 |
| JP | 2003-322850 A | 11/2003 |
| JP | 2005-316470 A | 11/2005 |
| KR | 10-2005-0049411 A | 5/2005 |
| KR | 10-2005-0065432 A | 6/2005 |

* cited by examiner

*Primary Examiner* — Sumati Lefkowitz
*Assistant Examiner* — Jesus Hernandez
(74) *Attorney, Agent, or Firm* — Lee & Morse

(57) ABSTRACT

Example embodiments relate to a display device having first and second substrates arranged opposite to each other, a semiconductor device on the first substrate, an organic light emitting element on the first substrate and an optical unit between the organic light emitting element and the second substrate. The display device may be configured to adjust angle viewing modes, e.g., a narrow angle viewing mode and a wide angle viewing mode, by selectively applying a voltage to the organic light emitting element and the optical unit.

18 Claims, 2 Drawing Sheets

DISPLAY DEVICE

BACKGROUND OF THE INVENTION

1. Field of the Invention

Example embodiments relate to a display device and, more particularly, to a display device for selectively limiting a viewing angle.

2. Description of the Related Art

Organic light emitting diode (OLED) displays are becoming widely used due to its small size, light-weight and energy efficiency characteristics. Accordingly, OLED displays are being applied to small, portable electronic devices, e.g., cellular phones, personal digital assistant devices and portable multimedia players. Since OLED displays may be incorporated into electronic devices that are generally carried by users, images displayed on the electronic devices may be observed at various viewing angles. In other words, images on the electronic devices may be observed at a non-direct line of sight. This may yield unauthorized or unwanted observers from viewing the images on the electronic devices.

One approach to limit the viewing angle has been to provide a polarizing plate or a polarizing film on an upper substrate of the display device. Such polarizing plate or film, however, generally relates to a fixed viewing angle and does not allow user control of the viewing angle.

SUMMARY OF THE INVENTION

Example embodiments are therefore directed to a display device that substantially overcome one or more of the problems due to the limitations and disadvantages of the related art.

It is therefore a feature of example embodiments to provide a display device having an OLED display for selectively limiting a viewing angle while maintaining high performance.

Another feature of example embodiments provides user control and selection over the viewing angle.

Another feature of example embodiments provides a display device that may be relatively thin.

At least one of the above and other features of example embodiments may provide a display device having first and second substrates arranged opposite to each other, a semiconductor device on the first substrate, an organic light emitting element on the first substrate, and an optical unit between the organic light emitting element and the second substrate.

The optical unit may include a liquid crystal layer and at least one sub-electrode on the second substrate.

The at least one sub-electrode may be in a non-light emitting region of the display device. The organic light emitting element may be in a light emitting region of the display device. The at least one sub-electrode may be transparent or semi-transparent and may be made using at least one of an indium tin oxide (ITO), an indium zinc oxide (IZO) and a magnesium-silver (MgAg) alloy.

The organic light emitting element may include a first pixel electrode, an organic light emitting layer and a second pixel electrode in a stacked configuration. The first pixel electrode, the organic light emitting layer, and the second pixel electrode may be electrically connected to the semiconductor device on the first substrate. The second pixel electrode and the at least one sub-electrode may be configured to drive the liquid crystal layer. The liquid crystal layer may be between the second pixel layer and the second substrate. The organic light emitting layer may be between the first pixel electrode and the second pixel electrode. The first pixel electrode may include a reflection layer. The first pixel electrode may be made using at least one of aluminum (Al), an aluminum-alloy (Al-alloy), silver (Ag), a silver-alloy (Ag-alloy), gold (Au) and a gold-alloy (Au-alloy). The second pixel electrode may be transparent. The second pixel electrode may be made using at least one of an indium tin oxide (ITO), an indium zinc oxide (IZO) and a magnesium-silver (MgAg) alloy.

The optical unit may be configured to randomly arrange liquid crystal molecules when a voltage is applied to the second pixel electrode and the at least one sub-electrode. The optical unit may be configured to substantially identically arrange the liquid crystal molecules when no voltage is applied to the second pixel electrode and the at least one sub-electrode.

The semiconductor device may be a thin film transistor. The organic light emitting element may be an OLED. The display device may be a portable display device.

BRIEF DESCRIPTION OF THE DRAWINGS

The above and other features and advantages of example embodiments will become more apparent to those of ordinary skill in the art by describing in detail example embodiments thereof with reference to the attached drawings, in which.

DETAILED DESCRIPTION OF THE INVENTION

Korean Patent Application No. 10-2007-0077727, filed on Aug. 2, 2007, in the Korean Intellectual Property Office and entitled: "Display Device," is incorporated by reference herein in its entirety.

Example embodiments will now be described more fully hereinafter with reference to the accompanying drawings; however, example embodiments may be embodied in different forms and should not be construed as limited to the embodiments set forth herein. Rather, these example embodiments are provided so that this disclosure will be thorough and complete, and will fully convey the scope of the invention to those skilled in the art.

Figure 1:
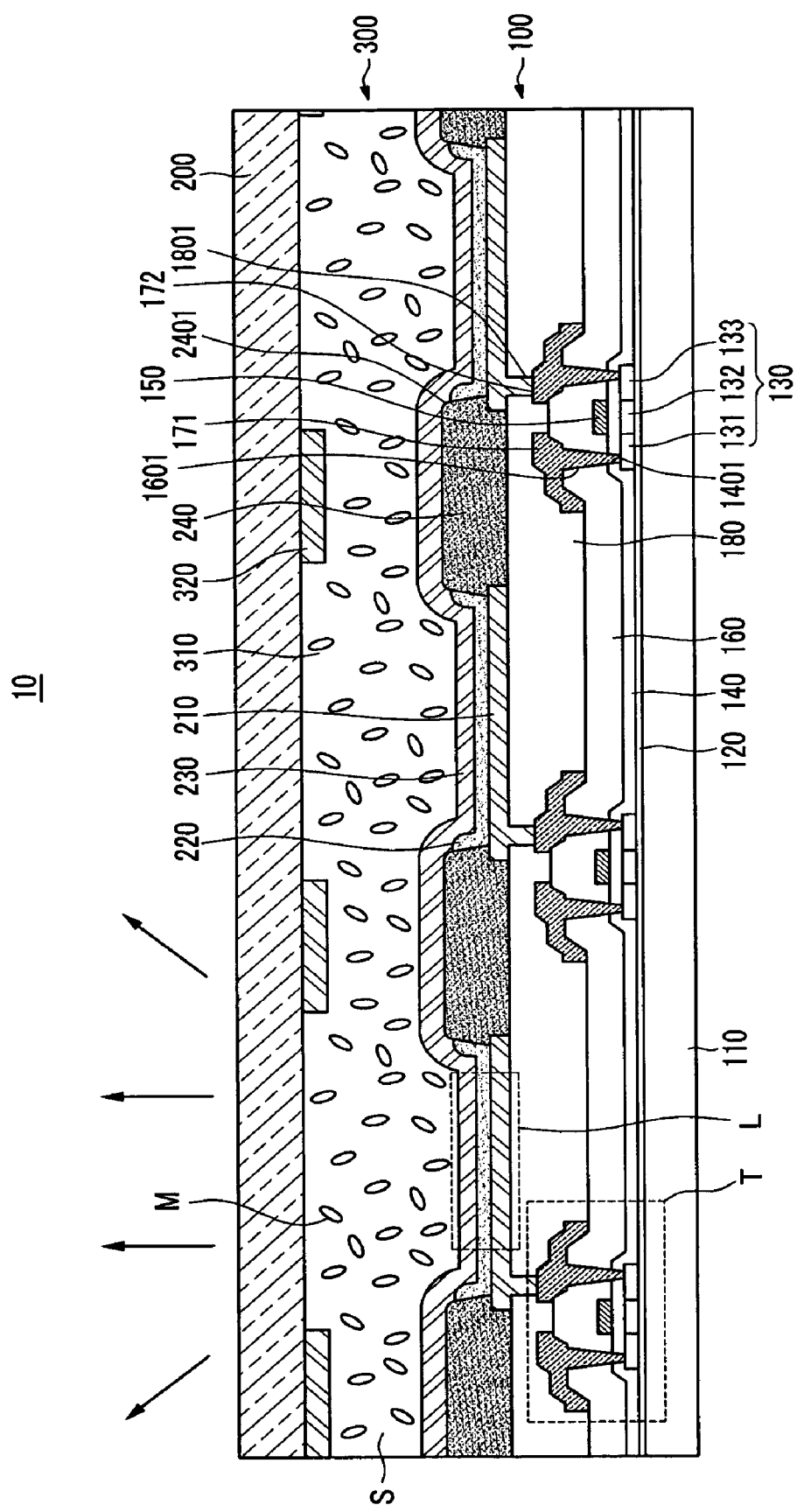
FIG. 1 illustrates a sectional view of a display device according to an example embodiment, when the display device is in a wide angle viewing mode.
Figure 2:
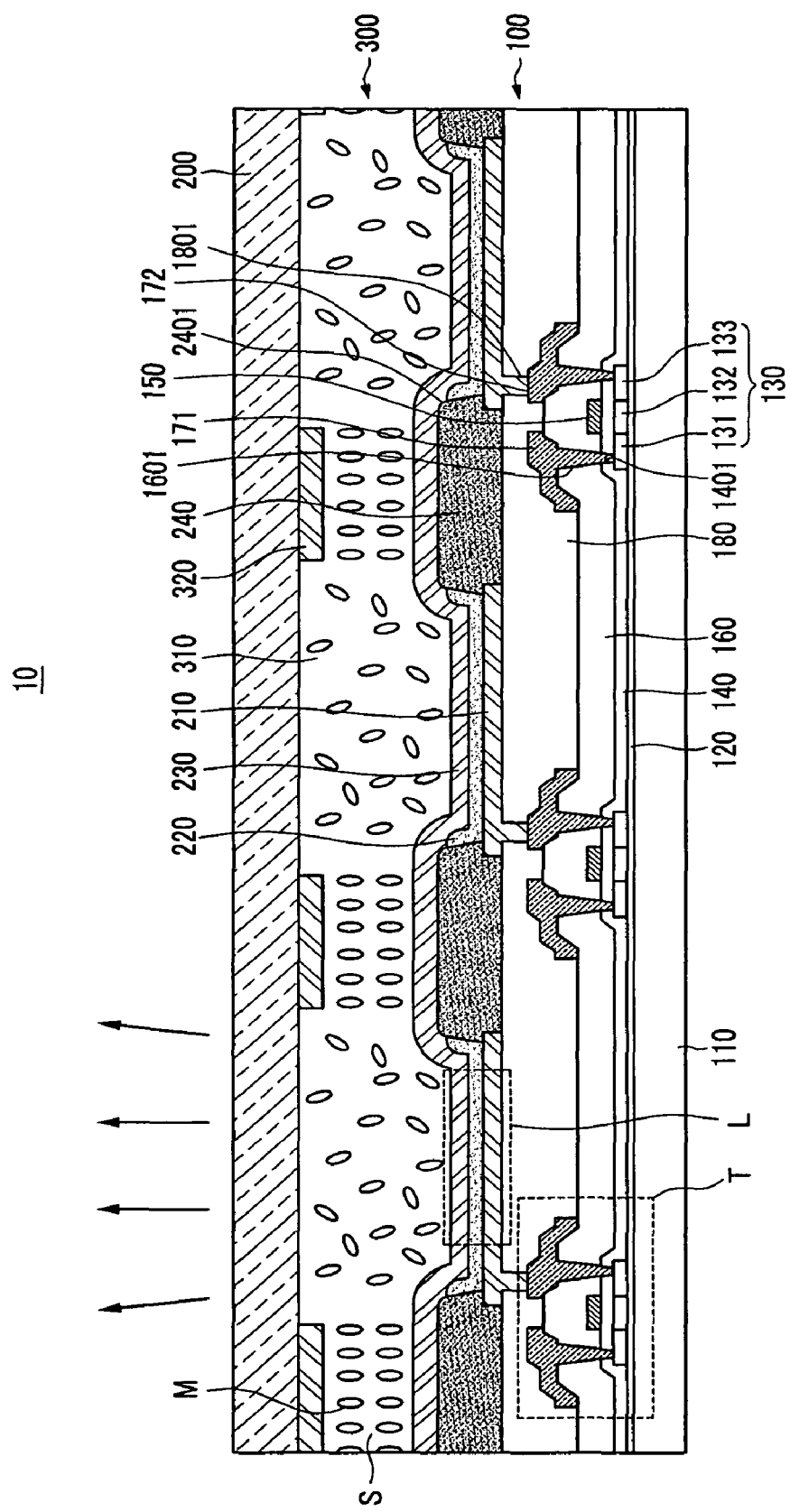
FIG. 2 illustrates a sectional view of the display device according to another example embodiment, when the display device is in a narrow angle viewing mode.

FIG. 1 illustrates a sectional view of a display device 10, when the display device 10 is in a wide angle viewing mode; and FIG. 2 illustrates a sectional view of the display device 10, when the display device 10 is in a narrow angle viewing mode.

Referring to FIG. 1, the display device 10 may include a display panel 100 for displaying an image and an optical unit 300 for adjusting a viewing angle of light emitted from the display panel 100. The display panel 100 may be used in OLED panels, liquid crystal display (LCD) panels or plasma display panels (PDPs).

The display panel 100 may include a plurality of pixels for displaying images and may be arranged in a matrix. For example, when the display panel 100 is an OLED panel, each of the pixels may include an OLED L that emits light to display the images and a semiconductor device, e.g., a thin film transistor T, for driving the OLED L.

The display panel 100 may include a buffer layer 120 formed on a substrate 110, and the thin film transistor T may be formed on the buffer layer 120. Further, a gate insulating layer 140 may be formed on the buffer layer 120, an interlayer dielectric layer 160 may be formed on the gate insulation layer 140 and a planarization layer 180 may be formed on the interlayer dielectric layer 160.

The thin film transistor T may include a semiconductor layer 130, a gate electrode 150, a source electrode 171 and a drain electrode 172, formed on the buffer layer 120. The semiconductor layer 130 may include a source region 131, a drain region 133 and a channel region 132 interconnecting the source and drain regions 131 and 133.

The gate insulating layer 140 may be formed on the buffer layer 120 while covering the semiconductor layer 130. The gate electrode 150 may be formed on the semiconductor layer 130 with the gate insulating layer 140 interposed therebetween.

Further, the interlayer dielectric layer 160 may be formed on the gate insulation layer 140 while covering the gate electrode 150. In an example embodiment, first and second contact holes 1401 and 1601 may respectively be formed in the gate insulation layer 140 and the interlayer dielectric layer 160, so that the source and drain regions 131 and 133 may be exposed through the first and second contact holes 1401 and 1601. Further, the source and drain electrodes 171 and 172 may be electrically connected to the exposed source and drain regions 131 and 133, respectively.

The substrate 110 may be formed of a metallic material, e.g., stainless steel (SUS) material, or an insulation material, e.g., glass or plastic. The buffer layer 120 may prevent and/or reduce impurities of the substrate 110 from diffusing when the semiconductor layer 130 is formed. The buffer layer 120 may be formed of a silicon nitride (SiN) layer or a multi-layer including a silicon nitride (SiN) layer and a silicon oxide ($SiO_2$) layer, for example. The gate electrode 150 may be a metal layer formed of at least one of molybdenum-tungsten (MoW) alloy, aluminum (Al), chromium (Cr) and aluminum/chromium-alloy (Al/Cr-alloy). The source electrode 171 and the drain electrode 172 may be formed of a titanium/aluminum-alloy (Ti/Al-alloy) or a titanium/aluminum/titanium-alloy Ti/Al/Ti-alloy. Other materials may be employed besides the one mentioned above.

The planarization layer 180 may be formed on the interlayer dielectric layer 160 while covering the thin film transistor T. A first pixel electrode 210, an organic light emitting layer 220 and a second pixel electrode 230 may be sequentially formed on the planarization layer 180 to form the OLED L.

The first pixel electrode 210 may be electrically connected to the drain electrode 172 of the thin film transistor T through a hole 1801 formed in the planarization layer 180. The first pixel electrode 210 may be electrically separated from an adjacent pixel by a pixel defining layer 240 and may contact the organic light emitting layer 220 through an opening 2401 formed in the pixel defining layer 240.

The second pixel electrode 230 may be formed on a surface of the substrate 110 so as to apply a voltage (e.g., a negative voltage) to the pixels arranged on the substrate 110. The first pixel electrode 210 may function to inject holes and the second pixel electrode 230 may function to inject electrons.

The first pixel electrode 210 may be a first transparent electrode formed of, for example, but not limited to, an indium tin oxide (ITO) or an indium zinc oxide (IZO). Further, the first pixel electrode 210 may be formed with a conductive reflection layer (not shown) and a second transparent electrode (not shown) to affect a light emitting direction of the OLED L. The conductive reflection layer may improve electric conductivity while enhancing luminous efficiency by reflecting the light emitted from the organic light emitting layer 220. The conductive reflection layer may be formed of aluminum (Al), an aluminum-alloy (Al-alloy), silver (Ag), a silver-alloy (Ag-alloy), gold (Au), a gold-alloy (Au-alloy) or other combination of suitable materials. The second transparent electrode may suppress and/or reduce oxidation of the conductive reflection layer and may improve performance between the organic light emitting layer 220 and the conductive reflection layer. Similar to the first transparent electrode, the second transparent electrode may be formed of similar materials, e.g., ITO or IZO.

The organic light emitting layer 220 may include a light emitting layer (not shown) and organic layers (not shown). The light emitting layer may be the element that emits light. The organic layers may be respectively formed on opposite surfaces of the light emitting layer to transfer carriers, e.g., holes and electrons, to the light emitting layer. For example, the organic layer may include at least one of a hole injection layer and a transport layer formed between the first pixel electrode 210 and the light emitting layer, and at least one of an electron injection layer and a transport layer formed between the light emitting layer and the second pixel electrode 230.

The second pixel electrode 230 may be a transparent conductive layer so as to emit light in the directions as shown by arrows in FIGS. 1 and 2. The transparent conductive layer may be formed of a material, e.g., ITO, IZO or an alloy made of magnesium and silver (MgAg).

The thin film transistors T and the OLEDs L, formed on the substrate 110, may be enclosed by sealing the display panel 100 with a sealing substrate 200 creating a space S. The space S may be defined as a region between the display panel 100 and the sealing substrate 200. The optical unit 300 may be formed in the space S. In detail, the optical unit 300 may be formed between the second pixel electrode 230 and the sealing plate 200 without using a separate substrate. The optical unit 300 may further be provided on the display panel 100 so as to adjust the viewing angle by adjusting the light emitted from the display panel 100.

The optical unit 300 may include a liquid crystal layer 310 and a plurality of sub-electrodes 320. The liquid crystal layer 310 may be formed by filling the space S with liquid crystal molecules M. The sub-electrodes 320 may be formed on a surface, e.g., an inner surface, of the sealing substrate 200.

The sub-electrodes 320 may be spaced apart from each other by a predetermined distance and may correspond to a non-light emitting region, e.g., a region where no OLED L is disposed. Accordingly, because the sub-electrodes 320 do not interfere with light emitting regions excited by the light emitted from the OLED L, the deterioration of the luminous efficiency may be prevented and/or reduced. The sub-electrodes 320 may be arranged in a configuration other than the one illustrated in FIGS. 1 and 2, as long as the sub-electrodes 320 do not block/interfere with light from the OLED L. The sub-electrodes 320 may be formed of a transparent or a semi-transparent conductive material, e.g., ITO, IZO or MgAg alloy. When the sub-electrodes 320 are formed of a MgAg alloy, the transmittance of light may be adjusted by adjusting a thickness thereof.

Now, a method of adjusting viewing angles of light emitted from the display device 10 by selectively applying a voltage to the display panel 100 will be described in detail.

In particular, when a voltage is applied to the second pixel electrode 230, a predetermined voltage may be applied to the sub-electrodes 320 to form an electric field between the second pixel electrode 230 and the sub-electrodes 320. The liquid crystal layer 310 may then be driven by the electric field, e.g., the liquid crystal layer 310 may transmit (or intercept) the light at each unit pixel in accordance with the electric field formed between the second pixel electrode 230 and the sub-electrodes 320. Accordingly, the electric field may selectively control the arrangement of the liquid crystal molecules M in the liquid crystal layer 310 to provide different viewing angles, e.g., a wide angle viewing mode or a narrow angle viewing mode.

In the wide angle viewing mode (as illustrated in FIG. 1), the voltage may be applied to the second pixel electrode 230 and the sub-electrodes 320 by selectively turning on the second pixel electrode 230 and the sub-electrodes 320 so that the liquid crystal molecules M may be in an "open" state, e.g., the liquid crystal molecules M may not be oriented in a substantially identical direction so that the light emitted from the display panel 100 may pass through the liquid crystal layer 310. In other words, the liquid crystal molecules M may be randomly oriented in the liquid crystal layer 310. This configuration provides the wide angle viewing mode and, thus, the image may be displayed as illustrated in arrow directions in FIG. 1.

In the narrow angle viewing mode (as illustrated in FIG. 2), the voltage may not be applied to the second pixel electrode 230 and the sub-electrodes 320 by selectively turning off the second pixel electrode 230 and the sub-electrodes 320 so that the liquid crystal molecules M may be in a "closed" state, e.g., the liquid crystal molecules M may be oriented in a substantially identical direction so that the light emitted from the display panel 100 may be intercepted at a region where the liquid crystal molecules M are arranged. In other words, the liquid crystal molecules M may be substantially uniformly oriented in the liquid crystal layer 310. This configuration provides the narrow angle viewing mode and, thus, the image may be displayed as illustrated in arrow directions in FIG. 2. Further, the orientation of the liquid crystal molecules M may be controlled in an opposite manner to the above, e.g., the liquid crystal molecules M in the open state may be in a substantially identical direction and the liquid crystal molecules M in the closed state may be in a random direction.

As a result, by turning on or off the second pixel electrode 230 and the sub-electrodes 320, the viewing angle of the display device 10 may be selectively limited.

Further, because the optical unit 300 may be formed by utilizing the substrate 110 and the second pixel electrode 230 and the sub-electrodes 320, instead of utilizing a separate substrate, no additional panel may be required for adjusting the viewing angle. As a result, the thickness of the display device 10 may be reduced. Further, because an orientation of a liquid crystal layer 310 may be controlled using internal electrodes of the display panel 10, the manufacturing process of the display device 10 may be simplified.

In the figures, the thickness of layers, panels, regions, substrates, etc., are exaggerated for clarity. It will be understood that when an element such as a layer, a a panel, a region, or a substrate is referred to as being "on" another element, it can be directly on the other element or intervening elements may also be present. In contrast, when an element or layer is referred to as being "directly on," "directly connected to" or "directly coupled to" another element or layer, there are no intervening elements or layers present. Further, it will be understood that when a layer, film, region, or substrate is referred to as being "under" or "above" another layer, it can be directly under or directly above, and one or more intervening layers, films, panels, regions, substrates may also be present. In addition, it will also be understood that when a layer is referred to as being "between" two layers, it can be the only layer between the two layers, or one or more intervening layers may also be present. Further, when it is described that a unit "includes" a constituent element, it means that the unit may further include other constituent elements in addition to the element unless specifically referred to the contrary. Like numbers refer to like elements throughout. As used herein, the term "and/or" includes any and all combinations of one or more of the associated listed items.

It will also be understood that, although the terms "first" and "second" etc. may be used herein to describe various elements, regions, or layers, and should not be limited by these terms. These terms are only used to distinguish an element, region, or layer from another elements, regions, or layers. Thus, a first element, region, or layer discussed herein could be termed a second element, region, or layer without departing from the teachings of example embodiments.

Spatially relative terms, such as "formed on," "lower," "below," "upper," "above," "between," "opposite," "correspond" and the like, may be used herein for ease of description to describe one element or feature relationship to another element(s) or feature(s) as illustrated in the figures. It will be understood that the spatially relative terms are intended to encompass different orientations of the device in use or operation in addition to the orientation depicted in the figures. For example, if the device in the figures is turned over (or upside down), elements or layers described as "below" other elements or layers would then be oriented "above" the other elements or layers. Thus, the example term "below" can encompass both an orientation of above and below. The device may be otherwise oriented (rotated 90 degrees or at other orientations) and the spatially relative descriptors used herein interpreted accordingly.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the example embodiments as set forth in the following claims.

What is claimed is:

1. A display device, comprising:
    first and second substrates arranged opposite to each other;
    a semiconductor device on the first substrate;
    an organic light emitting element on the first substrate, the organic light emitting element includes a first pixel electrode, an organic light emitting layer, and a second pixel electrode in a stacked configuration, the first pixel electrode, the organic light emitting layer, and the second pixel electrode being configured to be electrically connected to the semiconductor device on the first substrate; and
    an optical unit between the organic light emitting element and the second substrate, the optical unit including a liquid crystal layer and at least one sub-electrode on the second substrate, the second pixel electrode of the organic light emitting element and the at least one sub-electrode of the optical unit being configured to drive the liquid crystal layer,
    wherein the at least one sub-electrode is in a region of the display device opposite a region of the first substrate not having the organic light emitting element, and
    wherein a voltage applied to the second pixel electrode interacts separately with the first pixel electrode and the at least one sub-electrode.

2. The display device as claimed in claim 1, wherein the organic light emitting element is in a light emitting region of the display device.

3. The display device as claimed in claim 1, wherein the at least one sub-electrode is transparent or semi-transparent.

4. The display device as claimed in claim 2, wherein the at least one sub-electrode is made using at least one of an indium tin oxide (ITO), an indium zinc oxide (IZO) and a magnesium-silver (MgAg) alloy.

5. The display device as claimed in claim 1, wherein the liquid crystal layer is between the second pixel electrode and the second substrate.

6. The display device as claimed in claim 1, wherein the first pixel electrode includes a reflection layer.

7. The display device as claimed in claim 6, wherein the first pixel electrode is made using at least one of aluminum (Al), an aluminum-alloy (Al-alloy), silver (Ag), a silver-alloy (Ag-alloy), gold (Au) and a gold-alloy (Au-alloy).

8. The display device as claimed in claim 1, wherein the second pixel electrode is transparent.

9. The display device as claimed in claim 8, wherein the second pixel electrode is made using at least one of an indium tin oxide (ITO), an indium zinc oxide (IZO) and a magnesium-silver (MgAg) alloy.

10. The display device as claimed in claim 1, wherein the optical unit is configured to randomly arrange liquid crystal molecules when a voltage is applied to the second pixel electrode and the at least one sub-electrode.

11. The display device as claimed in claim 10, wherein the optical unit is configured to substantially identically arrange the liquid crystal molecules when no voltage is applied to the second pixel electrode and the at least one sub-electrode.

12. The display device as claimed in claim 1, wherein the display device is a self-emissive display device.

13. The display device as claimed in claim 1, wherein the semiconductor device and the organic light emitting element define a display panel between the first and second substrates, the optical unit being positioned between the display panel and the second substrate.

14. The display device as claimed in claim 1, wherein:
the organic light emitting element is between the semiconductor device and the optical unit, the organic light emitting element directly facing the liquid crystal layer of the optical unit, and the semiconductor device is between the first substrate and the organic light emitting element.

15. The display device as claimed in claim 1, wherein the liquid crystal layer is directly between the at least one sub-electrode and an upper electrode of the organic light emitting element.

16. An organic light emitting display device, comprising:
first and second substrates arranged opposite to each other;
a display panel between the first and second substrates, the display panel including a semiconductor device and an organic light emitting element on the first substrate, the organic light emitting element includes a first pixel electrode, an organic light emitting layer, and a second pixel electrode in a stacked configuration, the first pixel electrode, the organic light emitting layer, and the second pixel electrode are configured to be electrically connected to the semiconductor device on the first substrate; and
an optical unit between the display panel and the second substrate, the optical unit including a liquid crystal layer and at least one sub-electrode between the liquid crystal layer and the second substrate, the second pixel electrode and the at least one sub-electrode of the optical unit being configured to drive the liquid crystal layer,
wherein the at least one sub-electrode is in a region of the display device opposite a region of the first substrate not having the organic light emitting element, and
wherein a voltage applied to the second pixel electrode interacts separately with the first pixel electrode and the at least one sub-electrode.

17. The organic light emitting display device as claimed in claim 16, wherein the optical unit is configured to selectively limit a viewing angle of an image on the display panel.

18. The organic light emitting display device as claimed in claim 16, wherein the optical unit is external to the display panel.

* * * * *